(12) United States Patent
Yamada

(10) Patent No.: US 6,811,369 B2
(45) Date of Patent: Nov. 2, 2004

(54) SEMICONDUCTOR FABRICATION APPARATUS, POD CARRY APPARATUS, POD CARRY METHOD, AND SEMICONDUCTOR DEVICE PRODUCTION METHOD

(75) Inventor: Kohei Yamada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 135 days.

(21) Appl. No.: 10/101,706

(22) Filed: Mar. 21, 2002

(65) Prior Publication Data

US 2002/0141850 A1 Oct. 3, 2002

Related U.S. Application Data

(63) Continuation-in-part of application No. 09/537,874, filed on Mar. 29, 2000, now abandoned.

(30) Foreign Application Priority Data

Sep. 2, 1999 (JP) ............................................. 11-248159

(51) Int. Cl.[7] .............................................. B65G 1/133
(52) U.S. Cl. ..................... 414/217.1; 414/939; 414/940
(58) Field of Search ........................ 414/217.1, 416.01, 414/939, 940, 805, 806; 118/500, 719

(56) References Cited

U.S. PATENT DOCUMENTS

| | | | |
|---|---|---|---|
| 4,532,970 A | 8/1985 | Tullis et al. .................... 141/98 |
| 4,534,389 A | 8/1985 | Tullis et al. .................... 141/98 |
| 4,616,683 A | 10/1986 | Tullis et al. .................... 141/98 |
| 4,826,360 A | * 5/1989 | Iwasawa et al. .......... 414/217.1 |
| 5,372,471 A | * 12/1994 | Wu .............................. 414/940 |
| 5,388,945 A | 2/1995 | Garric et al. ............. 414/217.1 |
| 5,829,939 A | * 11/1998 | Iwai et al. .................... 414/940 |
| 5,957,648 A | * 9/1999 | Bachrach ...................... 414/939 |
| 6,050,891 A | * 4/2000 | Nering ......................... 414/939 |
| 6,074,154 A | * 6/2000 | Ueda et al. .................. 414/940 |
| 6,079,927 A | * 6/2000 | Muka .......................... 414/939 |
| 6,099,059 A | 8/2000 | Schultz et al. ............ 294/119.1 |
| 6,283,692 B1 | 9/2001 | Perlov et al. ........... 414/222.01 |
| 6,318,945 B1 | * 11/2001 | Hofmeister .................. 414/939 |
| 6,447,232 B1 | * 9/2002 | Davis et al. ............. 414/217.1 |
| 6,540,466 B2 | * 4/2003 | Bachrach ................. 414/217.1 |

FOREIGN PATENT DOCUMENTS

JP  10-242241  9/1998

* cited by examiner

Primary Examiner—Eileen D. Lillis
Assistant Examiner—Thuy V. Tran
(74) Attorney, Agent, or Firm—Fitzpatrick, Cella, Harper & Scinto

(57) ABSTRACT

In a semiconductor fabrication apparatus, a pod that receives a single substrate using a substrate supporting table and a lid member in a sealing state is loaded from outside of a chamber and the pod is opened within the chamber so as to enable the substrate received in the pod to be held and managed. The semiconductor fabrication apparatus includes a first pod conveyance device that transfers the pod from a pod loading position to a pod opening position, a pod opening device that causes the lid member of the pod transferred by said first pod conveyance device to be left outside the chamber and causes the supporting table to be separated into the chamber from the pod. A substrate storage rack provided within the chamber stores a plurality of substrates, and a substrate carrying device provided within the chamber takes out the substrate on the substrate supporting table and puts the substrate into the substrate storage rack.

10 Claims, 15 Drawing Sheets

FIG. 12

STATE UPON START OF SEQUENCE IN MANAGEMENT TABLE
(BEFORE TRANSFER OF POD P006)

|     | Reticle_ID | Pod_ID | STATUS  |
| --- | ---------- | ------ | ------- |
| RS1 | EMPTY      | —      | —       |
| RS2 | EMPTY      | —      | —       |
| RS3 | R003       | —      | EXECUTE |
| RS4 | R004       | —      | PRESET  |
| RS5 | R005       | —      | —       |
| RS6 | EMPTY      | —      | —       |
| LP1 | EMPTY      | EMPTY  | —       |
| LP2 | R007       | P007   | —       |
| LP3 | R008       | P008   | —       |
| PS1 | R001       | P001   | —       |
| PS2 | R002       | P002   | —       |
| PS3 | R003       | P003   | RS3     |
| PS4 | R004       | P004   | RS4     |
| PS5 | R005       | P005   | RS5     |
| PS6 | R006       | P006   | —       |

FIG. 13

STATE IN STEP 26 IN MANAGEMENT TABLE

|  | Reticle_ID | Pod_ID | STATUS |
|---|---|---|---|
| RS1 | EMPTY | — | — |
| RS2 | EMPTY | — | — |
| RS3 | R003 | — | EXECUTE |
| RS4 | R004 | — | PRESET |
| RS5 | R005 | — | — |
| RS6 | EMPTY | — | — |
| LP1 | R006 | P006 | TRANSFER |
| LP2 | R007 | P007 | — |
| LP3 | R008 | P008 | — |
| PS1 | R001 | P001 | — |
| PS2 | R002 | P002 | — |
| PS3 | R003 | P003 | RS3 |
| PS4 | R004 | P004 | RS4 |
| PS5 | R005 | P005 | RS5 |
| PS6 | EMPTY | EMPTY | — |

FIG. 14

STATE IN STEP 37 IN MANAGEMENT TABLE
(POD P006 STOCKED IN PS6)

|  | Reticle_ID | Pod_ID | STATUS |
|---|---|---|---|
| RS1 | EMPTY | — | — |
| RS2 | EMPTY | — | — |
| RS3 | R003 | — | EXECUTE |
| RS4 | R004 | — | PRESET |
| RS5 | R005 | — | — |
| RS6 | R006 | — | — |
| LP1 | EMPTY | EMPTY | — |
| LP2 | R007 | P007 | — |
| LP3 | R008 | P008 | — |
| PS1 | R001 | P001 | — |
| PS2 | R002 | P002 | — |
| PS3 | R003 | P003 | RS3 |
| PS4 | R004 | P004 | RS4 |
| PS5 | R005 | P005 | RS5 |
| PS6 | R006 | P006 | RS6 |

SEMICONDUCTOR FABRICATION APPARATUS, POD CARRY APPARATUS, POD CARRY METHOD, AND SEMICONDUCTOR DEVICE PRODUCTION METHOD

This is a continuation-in-part application of U.S. patent application Ser. No. 09/537,874 filed on Mar. 29, 2000 now abandoned.

BACKGROUND OF THE INVENTION

1. Field of the Invention

The present invention relates to a semiconductor fabrication apparatus such as semiconductor exposure apparatus etc. using a so-called standard mechanical interface system (SMIF system), for example, which supplies and retrieves substrates by use of an openable/closable container (pod) capable of keeping clean a cassette containing substrates such as semiconductor wafers, reticles, or the like, a pod carry apparatus, a pod carry method, and a semiconductor device production method.

2. Related Background Art

In conventional semiconductor fabrication processes, particularly, in the photolithography process, the substrates such as the semiconductor wafers or the like have been processed heretofore in a clean room controlled in the cleanliness level of dust of the submicron order, which could cause semiconductor device/element defects, in order to increase the yield. Since high integration of semiconductor devices and elements and micropatterning of circuitry is already in an advanced stage nowadays, it is not easy in terms of technology and cost to realize the clean room under control of the level of dust of small particle sizes according thereto.

As an alternative to increase in the cleanliness level of the clean room, the SMIF systems enabling clean carry of substrates have been proposed in such layout that a cassette or the like containing substrates is set in an openable/closable pod kept clean inside and that an opening/closing mechanism of this pod is installed in semiconductor fabrication equipment, for example as described in U.S. Pat. Nos. 4,532,970, 4,534,389, 4,616,683, and so on.

For example, the system illustrated in FIGS. 8A and 8B was developed as an SMIF system for transfer of reticles in semiconductor exposure equipment.

This system is provided with an opening/closing mechanism (SMIF indexer) 103 for opening/closing an SMIF pod 102 and moving a reticle carrier (cassette) 102a stored therein, up and down to withdraw the carrier out of the pod 102, a fork-shaped hand 104 for taking a reticle 102b out of the cassette 102a drawn pinto the semiconductor exposure apparatus 101 by the SMIF indexer 103, and a carrying mechanism 105 for moving the hand 104 back and forth and up and down relative to the cassette 102a to take the reticle 102b out and carry the reticle to a pre-alignment stage not illustrated. In order to prevent contamination of the reticle 102b carried by the carrying mechanism 105 and reduce the time necessary for replacement of reticles 102b, the height during the draw of the reticle 102b out of the cassette 102a is approximately matched with the height during the carry of the reticle 102b to the pre-alignment stage, thereby decreasing the length of the carry path.

For this reason. a pod mount surface $T_1$ of the SMIF indexer 103 is located a little above a reticle carry surface $T_2$, which is equal to the height during the draw of the reticle. Since the height of the reticle carry surface $T_2$ is set to be approximately equal to the height of the reticle stage of the exposure apparatus, it is 1400 mm or higher from the floor surface.

In the above prior art, however, since the pod mount surface is higher than 1400 mm from the floor surface as described above, it is not easy for an operator to replace the pods, and It is not easy to supply and retrieve the pods by use of an automatic guided vehicle (AGV) of a floor running type which runs on the floor surface, either. As a consequence, it is essential to use an AGV of a ceiling-track running type which runs on a track hanging down from the ceiling of the clean room. This increases the facility cost and also increases constraints on the layout.

On the other hand, when the position of the SMIF indexer is set at the height of 800 to 1100 mm in order to be ready for the pod replacement by the operator and for the AGV of the floor running type, the distance is increased considerably for the carry of the reticle in the chamber for controlling the environment in the semiconductor fabrication equipment in a clean state. This raises the possibility that dust from the carry mechanism contaminates the clean environment in the chamber and the reticle. Conceivable means for preventing this are extensive countermeasures against production of dust: for example, the reticle drawn is again set in another cassette with a cap and then is transported, the driving section is combined with a rotary arm to suppress production of dust, and so on.

When a plurality of reticles are stored in the pod, the above method has the drawback of increasing the time necessary for the reticle replacement.

A further structural problem of the SMIF system is that the system is allowed to be equipped with only about two or three SMIF indexers and thus there still remains an issue of necessity for frequent pod replacement.

SUMMARY OF THE INVENTION

The present invention has been accomplished in view of the problems in the prior art as described above, and an object of the present invention is to provide a semiconductor fabrication apparatus, a pod carry apparatus, a pod carry method, and a semiconductor device production method capable of facilitating the pod replacement work by the operator or by the AGV of the floor running type in the semiconductor fabrication apparatus such as the semiconductor exposure. apparatus or the like using the SMIF system and capable of remarkably reducing the time necessary for the pod replacement by juxtaposition of a pod storage rack for storing a plurality of pods.

In a semiconductor,fabrication apparatus according to an aspect of the present invention, a substrate is carried by use of a pod in which a cassette containing the substrate is set, the semiconductor fabrication apparatus comprising:

first pod carry means for carrying said pod in a substantially vertical direction between a first height position and a second height position higher than said first height position; and second pod carry means for carrying said pod substantially at said second height position in a substantially horizontal direction between said first pod carry means and pod opening/closing means disposed at a chamber for controlling environment in the semiconductor fabrication apparatus.

The semiconductor fabrication apparatus according to a further aspect of the present invention carries the substrate by a Standardized Mechanical Interface system.

The semiconductor fabrication apparatus according to a further aspect of the present invention further comprises a pod standby stage for keeping said pod standing by substantially at said second height position.

In the semiconductor fabrication apparatus according to a further aspect of the present invention, said pod standby stage comprises a transfer mechanist for transferring said pod.

In the semiconductor fabrication apparatus according to a further aspect of the present invention, said first pod carry means comprises a pod carry stage having a transfer mechanism for transferring said pod.

The semiconductor fabrication apparatus according to a further aspect of the present invention further comprises a pod storage rack for storing a plurality of pods, said pod storage rack being located near said first pod carry means.

In the semiconductor fabrication apparatus according to a further aspect of the present invention, said substrate is a reticle.

In the semiconductor fabrication apparatus according to a further aspect of the present invention, said first height position is in the range of 800 mm to 1100 mm from a floor surface.

In the semiconductor fabrication apparatus according to a further aspect of the present invention, said second height position is not less than 1400 mm from a floor surface.

In a pod carry apparatus according to one aspect of the present invention, a substrate set in a pod is carried by a Standardized Mechanical Interface system, the pod carry apparatus comprising:

first pod carry means for carrying said pod in a substantially vertical direction between a first height position and a second height position higher than said first height position; and second pod carry means for carrying said pod substantially at said second height position in a substantially horizontal direction between said first pod carry means and pod opening/closing means disposed at a chamber for controlling environment in a semiconductor fabrication apparatus.

In a pod carry method according to one aspect of the present invention, a substrate set in a pod is carried by a Standardized Mechanical Interface system, the pod carry method comprising:

a step of carrying said pod in a substantially vertical direction between a first height position and a second height position higher than said first height position by first pod carry means; and a step of carrying said pod substantially at said second height position in a substantially horizontal direction between said first pod carry means and pod opening/closing means provided at a chamber for controlling environment in a semiconductor fabrication apparatus, by second pod carry means.

A semiconductor device production method according to one aspect of the present invention makes use of the above-described semiconductor fabrication apparatus according to the present invention.

Still other objects of the present invention and the advantages thereof will become fully apparent from the following detailed description of the embodiments.

In another aspect of the invention, there is provided a semiconductor fabrication apparatus in which a pod that receives a single substrate using a substrate supporting table and a lid member in a sealing state is loaded from outside of a chamber and the pod is opened within the chamber so as to enable the substrate received in the pod to be held and managed, and said apparatus comprises a first pod conveyance device that transfers said pod from a pod loading position to a pod opening position, a pod opening device that causes the lid member of the pod transferred by said first pod conveyance device to be left outside the chamber and causes the supporting table to be separated into the chamber from said pod, a substrate storage rack provided within said chamber, said substrate storage rack capable of storing a plurality of substrates, and a substrate carrying device provided within said chamber for taking out the substrate on the substrate supporting table and putting the substrate into said substrate storage rack.

In still another aspect of the invention, there is provided A semiconductor fabrication apparatus in which a pod that receives a single substrate using a substrate supporting table and a lid member in a sealing state is loaded from outside of a chamber and the pod is opened within the chamber so as to enable the substrate received in the pod to be held and managed, and said apparatus comprises a first pod conveyance device that transfers said pod from a pod loading position to a pod opening position, a plurality of pod opening devices that cause the lid member of the pod transferred by said first pod conveyance device to be left outside the chamber and cause the supporting table to be separated into the chamber from said pod, a substrate storage rack provided within said chamber, said substrate storage rack capable of storing a plurality of substrates, a substrate carrying device provided within said chamber for taking out the substrate on the substrate supporting table and putting the substrate into said substrate storage rack, and a console device that executes table management for each pod ID of a plurality of pods disposed on said pod opening device and each shelf ID of a plurality of shelves allocated to said substrate storage rack.

In still another aspect of the invention, there is provided a semiconductor fabrication apparatus in which a pod that receives a single substrate using a substrate supporting table and a lid member in a sealing state is loaded from outside of a chamber and the pod is opened within the chamber so as to enable the substrate received in the pod to be held and managed, and said apparatus comprises a second pod conveyance device that allows said pod to be loaded and transfer said pod to a position at which said pod is delivered, a first pod conveyance device that receives said pod transferred by said second pod conveyance device at the delivered position and transfers said pod to a pod opening position, a pod opening device that causes the lid member of the pod transferred by said first pod conveyance device to be left outside the chamber and causes the supporting table to be separated into the chamber from said pod, a substrate storage rack provided within said chamber, said substrate storage rack capable of storing a plurality of substrates, and a substrate carrying device provided within said chamber for taking out the substrate on the substrate supporting table and putting the substrate into said substrate storage rack.

In still another aspect of the invention, there is provided a semiconductor fabrication apparatus in which a pod that receives a single substrate using a substrate supporting table and a lid member in a sealing state is loaded from outside of a chamber and the pod is opened within the chamber so as to enable the substrate received in the pod to be held and managed, and said apparatus comprises a second pod conveyance device that allows said pod to be loaded and transfer said pod to a position at which said pod is delivered, a first pod conveyance device that receives said pod transferred by said second pod conveyance device at the delivered position and transfers said pod to a pod opening position, a pod opening device that causes the lid member of the pod transferred by said first pod conveyance device to be left outside the chamber and causes the supporting table to be separated into the chamber from said pod, a substrate storage rack provided within said chamber, said substrate storage rack capable of storing a plurality of substrates, a substrate carrying device provided within said chamber for taking out the substrate on the substrate supporting table and putting the substrate into said substrate storage rack, and a console device that executes table management for each pod ID of a plurality of pods disposed on said pod opening device and each shelf ID of a plurality of shelves allocated to said substrate storage rack.

In still another aspect of the invention, there is provided a semiconductor fabrication apparatus in which a pod that receives a single substrate using a substrate supporting table and a lid member in a sealing state is loaded from outside of a chamber and the pod is opened within the chamber so as to enable the substrate received in the pod to be held and managed, and said apparatus comprises a first pod conveyance device that transfers said pod from a pod loading position to a pod opening position, a plurality of pod opening devices that cause the lid member of the pod transferred by said first pod conveyance device to be left outside the chamber and cause the supporting table to be separated into the chamber from said pod, a substrate storage rack provided within said chamber, said substrate storage rack capable of storing a plurality of substrates, a substrate carrying device provided within said chamber for taking out the substrate on the substrate supporting table and putting the substrate into said substrate storage rack, a pod storage device capable of storing a plurality of pods in shelves, and a console device that executes table management for each shelf ID of a plurality of shelves allocated to said pod storage device, each pod ID of a plurality of pods stocked in the shelves of said pod storage device and each shelf ID of a plurality of shelves allocated to said substrate storage rack.

BRIEF DESCRIPTION OF THE DRAWINGS

FIG. 2A, FIG. 2B, and FIG. 2C show a pod lift stage and a pod standby stage, wherein FIG. 2A is a plan view thereof, FIG. 2B a cross-sectional view along a line 2B—2B of FIG. 2A, and FIG. 2C a cross-sectional view along a line 2C—2C of FIG. 2A;

FIG. 4A and FIG. 4B show the pod lift stage and a pod storage rack, wherein FIG. 4A is a plan view thereof and FIG. 4B is a cross-sectional view along a line 4B—4B of FIG. 4A;

FIG. 8A and FIG. 8B show the semiconductor exposure apparatus according to a conventional example, wherein FIG. 8A is a perspective view to show the outside view thereof and FIG. 8B is a partly enlarged, cross-sectional view to show the interior of the semiconductor exposure apparatus.

FIG. 12 shows a management table in a state upon start of sequence in the flowchart of FIG. 11.

FIG. 13 shows a management table in a state explained in the flowchart of FIG. 11.

FIG. 14 shows a management table in a state explained in the flowchart of FIG. 11.

DETAILED DESCRIPTION OF THE PREFERRED EMBODIMENTS

The preferred embodiments of the present invention will now be described in detail hereinafter with reference to the accompanying drawings. It is, however, noted that the present invention is by no means intended to be limited to the embodiments described hereinafter.

An embodiment of the present invention will be described with reference to the drawings.

Figure 1:
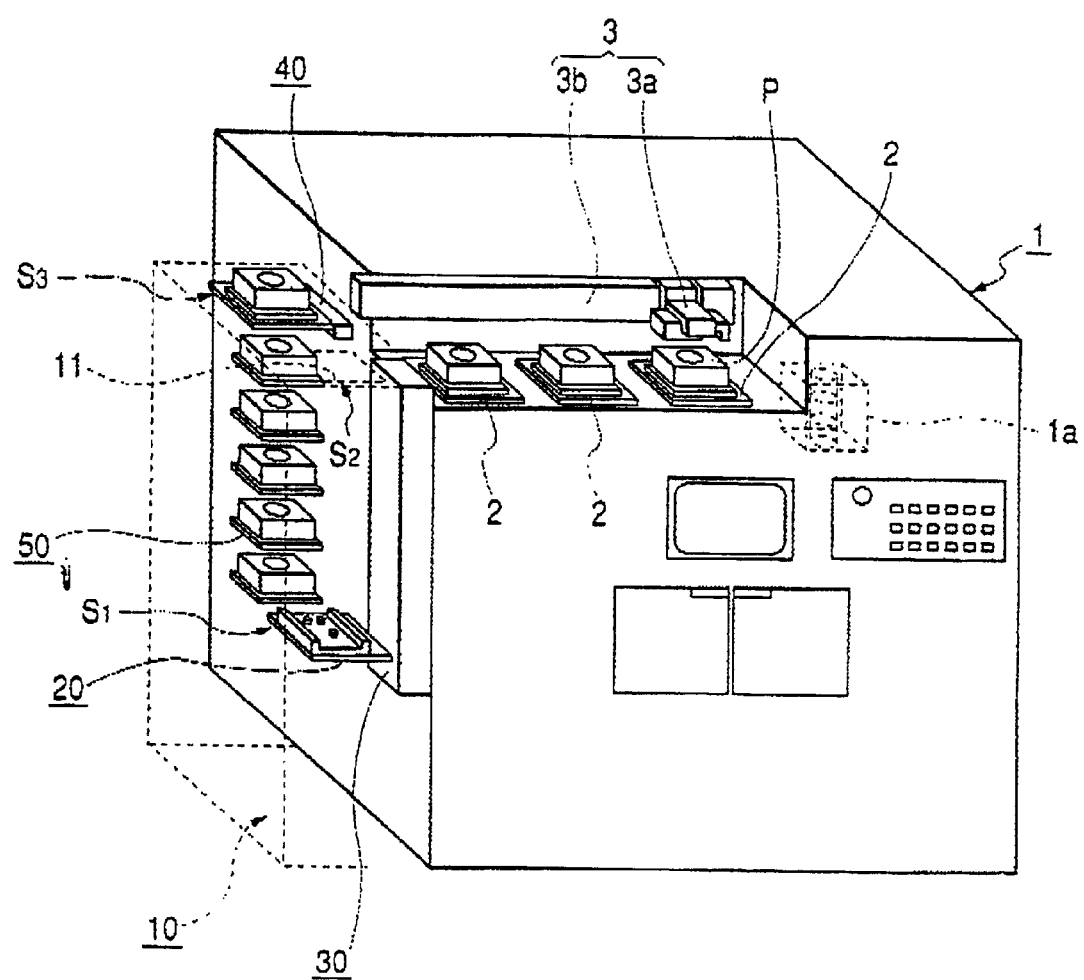
FIG. 1 is a perspective view to show the entire semiconductor fabrication apparatus according to an embodiment.

FIG. 1 shows the entire semiconductor fabrication apparatus according to the embodiment, in which a plurality of SMIF indexers 2 as opening/closing means of the SMIF systems for reticles being substrates, are disposed in the left upper part of the front of a chamber 1 for controlling the environment in the semiconductor fabrication apparatus. Inside the chamber 1, there are a reticle carry mechanism for carrying a reticle guided into the semiconductor fabrication apparatus by each SMIF indexer 2 and a reticle stocker 1a for storing reticles.

A plurality of indexers 2 are provided so as to be able to also function as pod standby units used in a semiconductor device fabricating process.

The height of the pod mount surface of the SMIF indexers 2 for opening and closing the pod P substantially hermetically closed is set a predetermined distance higher than the height of the reticle carry surface to the reticle stocker 1a.

A pod stocker 10 for storing a plurality of pods P is positioned on the side of the chamber 1. The pod stocker 10 is provided with a pod lift stage 20, and a lift mechanism 30 for moving the pod lift stage 20 up and down in a substantially vertical direction from a first position $S_1$, which is a first height position approximately 900 mm high from the floor surface, to a second position $S_2$, which is a second height position approximately 1400 mm or more high from the floor surface. When the pod lift stage 20 is located at the second position $S_2$ in the top part of the pod stocker 10, the pod lift stage 20 is exposed above and through an aperture 11 of the pod stocker 10 as described hereinafter. A pod P can be externally mounted in the second position $S_2$. A pod P transferred or mounted at the second position $S_2$ is transferred onto each SMIF indexer 2 by a horizontal carry robot 3 having a robot hand 3a adapted to grasp a handling member formed on the pod P and a vertical/horizontal movement means 3b for moving it vertically and horizontally. The mechanism of the vertical/horizontal movement means 3b is constructed of a known mechanism, for example, a pulse motor, a ball screw, a linear guide, or the like.

A pod standby stage 40 is provided at a third position $S_3$ located behind the aforementioned second position $S_2$. Further, a pod storage rack 50 having a plurality of shelves is located behind the area in which the pod lift stage 20 moves up from the first position $S_1$ to the second position $S_2$.

Figure 2C:
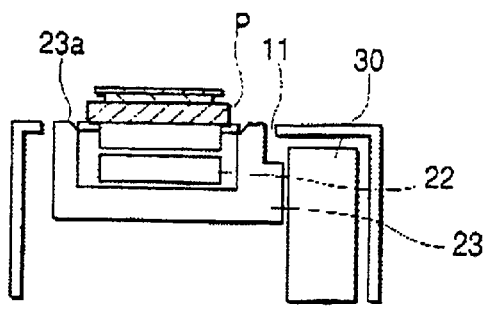
Figure 3:
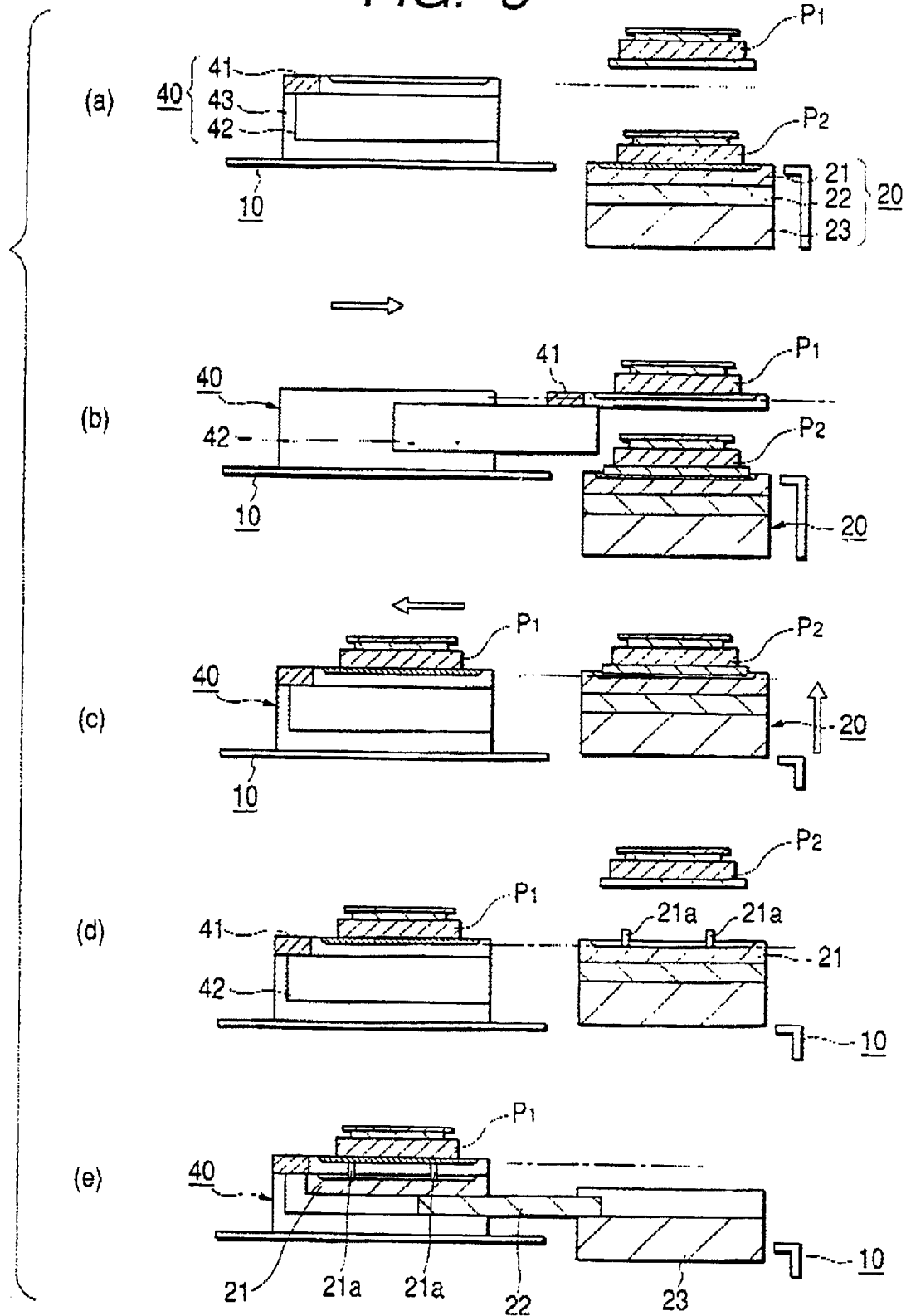
FIG. 3 is a diagram to explain a transfer step of a pod between the pod lift stage and the pod standby stage.

The pod lift stage 20, as illustrated in FIG. 3(*d*), is equipped with a base plate 21, which has three positioning pins 21*a* (see FIG. 3) to engage with positioning holes provided in the bottom surface of the pod P so as to position the pod P and a one-directional guide portion 21*b* for roughly positioning the pod by the contour thereof, a slide plate 22 as a transfer means for moving the base plate 21 back and forth in the horizontal direction, and a lift plate 23 cantilevered on the lift mechanism 30. A guide portion 23*a* for roughly positioning the pod P by the contour thereof is formed in the lift plate 23 as shown in FIG. 2C, and functions as a guide in the direction perpendicular to the guide portion 21*b* formed on the base plate 21.

Figure 2A:
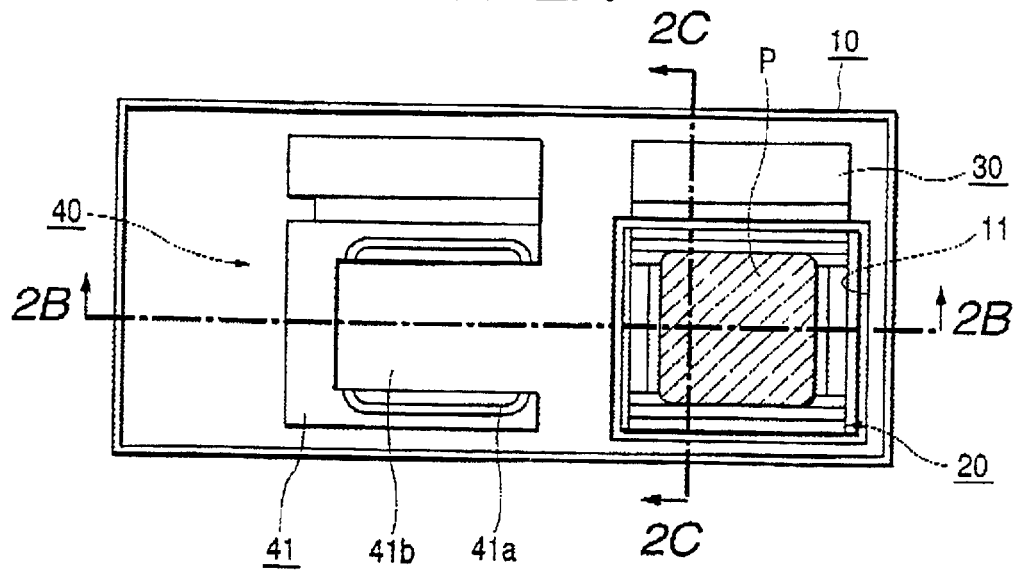
Figure 2B:
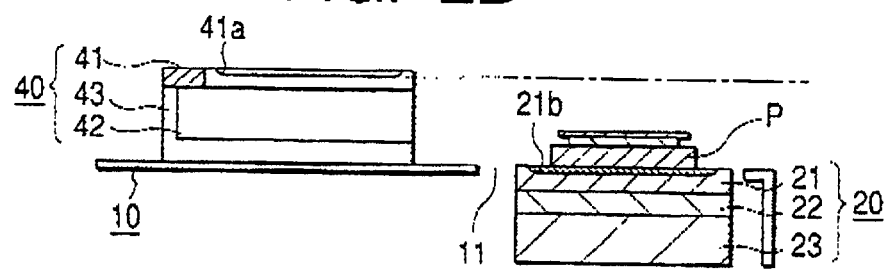

The pod standby stage 40 shown in FIG. 2B has a base plate 41, which has a guide portion 41*a* for positioning the pod in a plane, based on the contour of the pod, and a slit portion 41*b* for avoiding interference with the pod lift stage 20. a slide plate 42 as a transfer means for moving the base plate 41 back and forth in the horizontal direction, and a support plate 43 for supporting the slide plate 42. The support plate 43 is supported on the pod stocker 10.

FIG. 3 is a diagram to explain the sequence of replacing a retrieved pod $P_1$ on an arbitrary SMIF indexer 2 with a supplied pod $P_2$ to be supplied to an arbitrary SMIF indexer 2. The retrieved pod $P_1$ is carried to a position a little higher than the second S position $S_2$ by the robot hand 3*a* and the vertical/horizontal movement mechanism 3*b*, as illustrated in (*a*) of FIG. 3, and the supplied pod $P_2$ is mounted on the pod lift stage 20 to stand by at a position a little lower than the second position $S_2$ by the lift mechanism 30. Then the slide plate 42 of the pod standby stage 40 at the third position $S_3$ is moved to the second position $S_2$, as illustrated in (*b*) of FIG. 3, to receive the retrieved pod $P_1$ from the robot hand 3*a*. After the robot hand 3*a* released the retrieved pod $P_1$, the slide plate 42 of the pod standby stage 40 retracts the base plate 41 to the third position $S_3$, as illustrated in (*c*) of FIG. 3, and then the pod lift stage 20 is moved up to the second position $S_2$.

After the robot hand 3*a* has grasped the supplied pod $P_2$ and carried the supplied pod $P_2$ off the pod lift stage 20 (see (*d*) of FIG. 3), the pod lift stage 20 is moved down until the base plate 21 becomes lower than the bottom surface of the retrieved pod $P_1$ supported on the pod standby stage 40. Then the base plate 21 is moved to below the retrieved pod $P_1$ by the slide plate 22, as illustrated in (*e*) of FIG. 3, and the pod lift stage 20 is moved up. In this way the pod lift stage 20 receives the retrieved pod $P_1$ from the pod standby stage 40. After that, the base plate 21 and slide plate 22 of the pod lift stage 20 are moved back onto the lift plate 23. In cases wherein the operator or the like directly collects the pod, it is moved to the first position $S_1$. In cases wherein the pod is stocked in the pod stocker 10, it is placed on an arbitrary shelf (slot) of the pod storage rack 50 located below the pod standby stage 40.

The description herein concerned the sequence on the occasion of concurrence of retrieval and supply of pods, but it is needless to mention that in the case of only retrieval or only supply, the pod should be transferred directly between the pod lift stage 20 and the robot hand 3*a*.

Figure 4A:
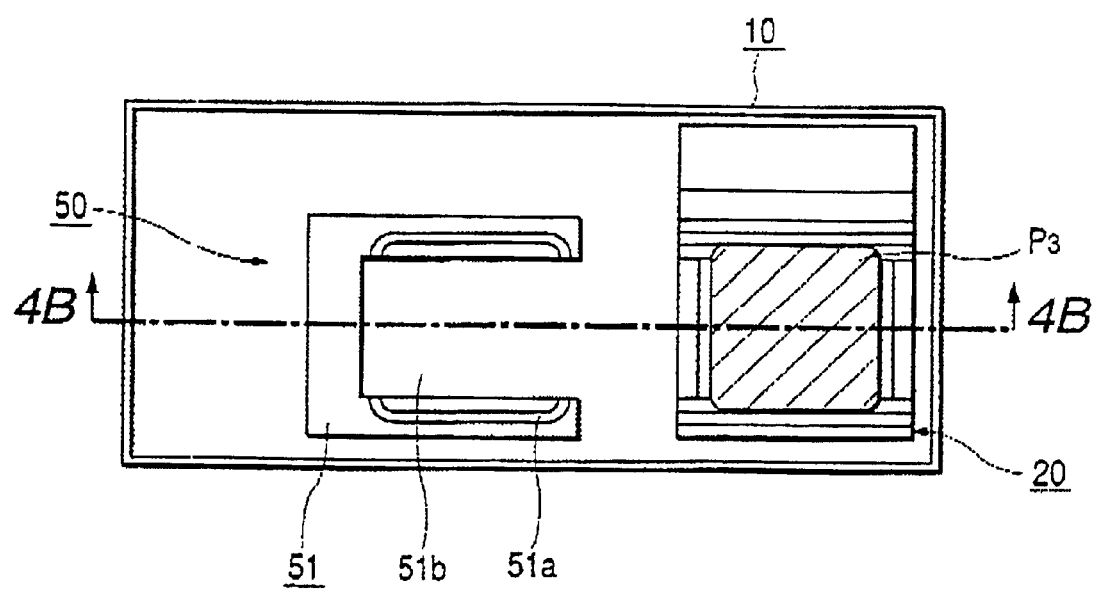
Figure 4B:
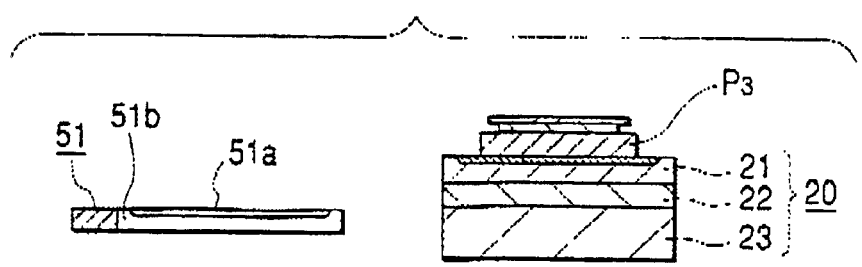
Figure 5:
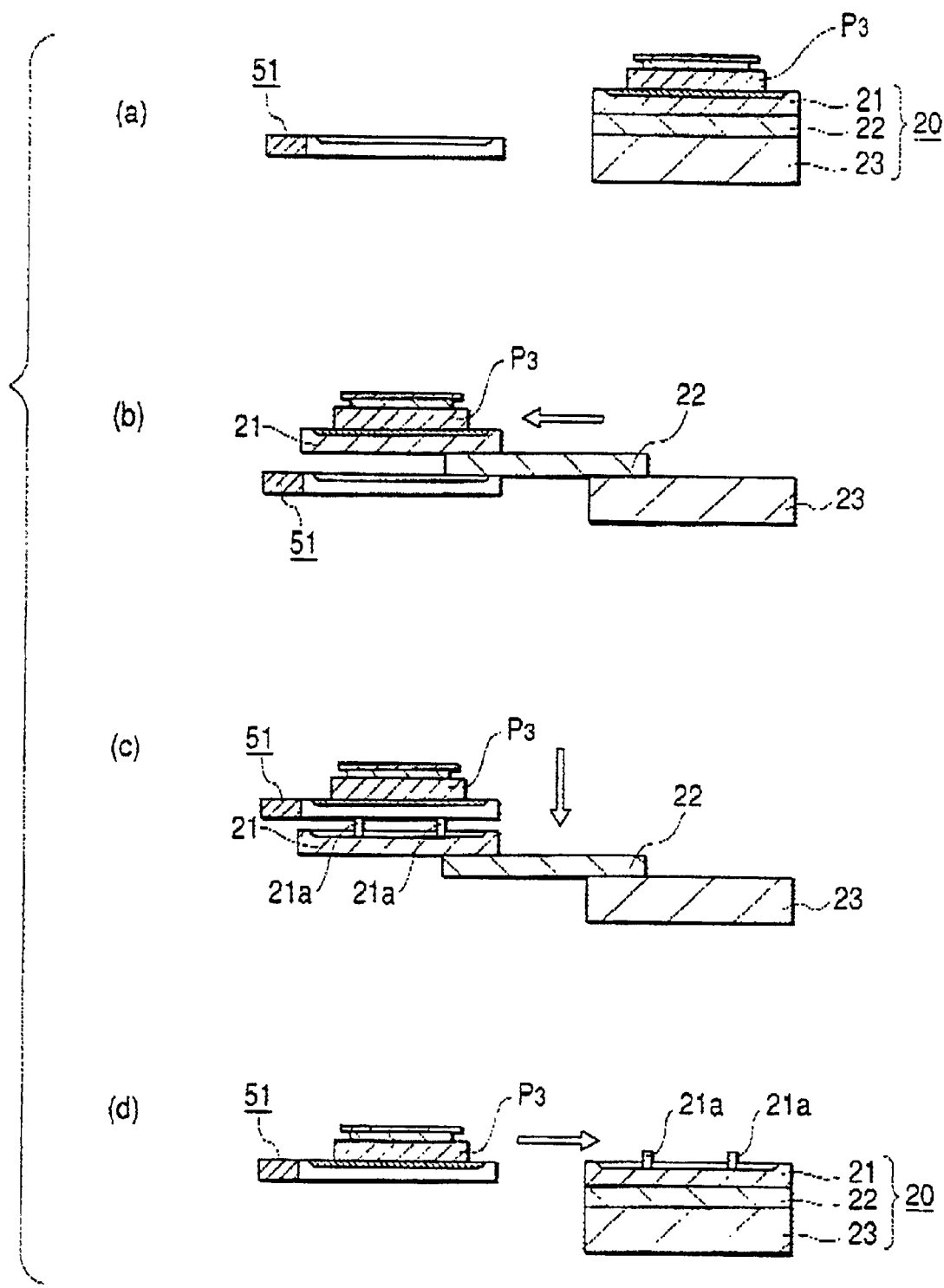
FIG. 5 is a diagram to explain a step of storing a pod from the pod lift stage onto the pod storage rack.

FIGS. 4A, 4B and FIG. 5 are diagrams to explain the structure of the pod storage rack 50 and the transfer of a pod onto a shelf. Each shelf of the pod storage rack 50 is provided with a shelf plate 51 having a guide portion 51*a* for positioning the pod $P_3$ in a plane by the contour thereof and a slit portion 51*b* for avoiding interference with the pod lift stage 20.

The transfer step of the pod $P_3$ to each shelf is carried out as follows; first, as illustrated in (*a*) of FIG. 5, while the pod lift stage 20 keeps thereon the pod $P_3$ to be stored on a designated slot (shelf), the pod lift stage 20 is moved to a position a little higher than the shelf plate 51 of the designated slot; thereafter, as Illustrated in (*b*), the base plate 21 is moved to above the shelf plate 51 by the slide plate 22; then the pod lift stage 20 is moved down by the lift mechanism 30, as illustrated in (*c*); the base plate 21 is moved back onto the lift plate 23 by the slide plate 22, as illustrated in (*d*), thereby completing the pod storage operation. The operation for taking the pod out is opposite to this operation.

Although in the present embodiment the pod standby stage 40 is located behind the pod lift stage 20 in order to minimize the foot print, it is a matter of course that the pod standby stage 40 may also be located between the SMIF indexers 2 on the chamber 1 and the pod lift stage 20. Further, the SMIF indexers 2 may be used as standby stages. In this case, the mechanical structure of the pod standby stage can be omitted to thereby obtain merits in savings of manufacturing costs.

Next, explanation will be made using FIG. 9 for a series of operations that the reticle R transferred to the indexer 2 is transferred into the chamber 1 and is stocked into the reticle stocker 1*a* provided within the chamber 1.

Figure 9:
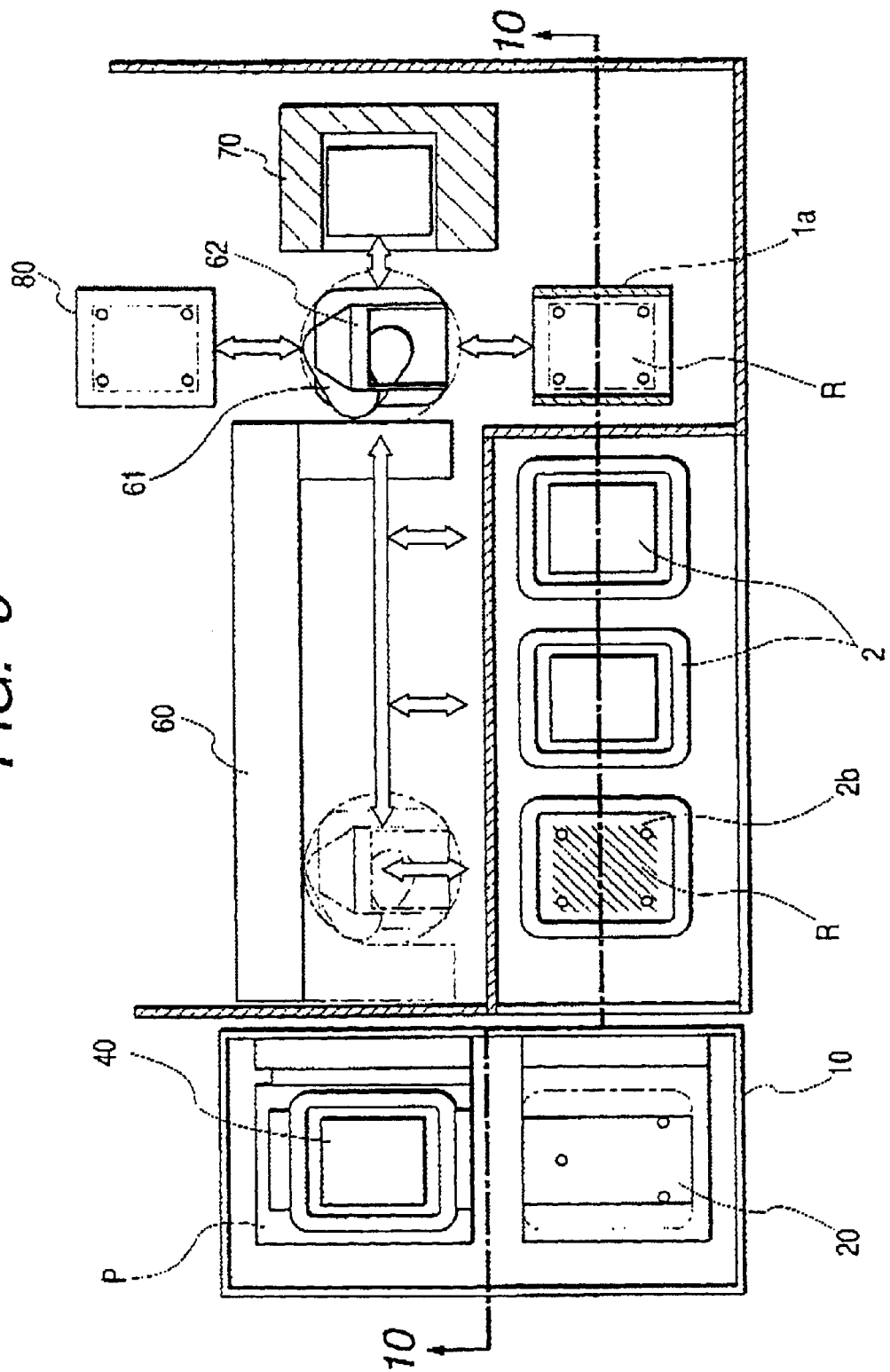
FIG. 9 is a plan view for explaining a configuration of conveyance of a pod and reticle according to the invention.

The pod stocker 10 and the pod standby stage 40 are illustrated in the left side of FIG. 9. In FIG. 9, the ceiling surface of the chamber 1 is removed for the sake of explanation of the inside of the chamber 1. Although there are provided a plurality of indexers 2 as mentioned in the foregoing, a lid portion 2*a* of the pod located at the left side is removed for the sake of explanation. The lid portion 2*a* of the pod is normally left at the chamber 1 side, and the supporting table 2*b* supporting the reticle R is moved down in the indexer 2 so as to enable the reticle R to be taken out.

Note that enough space is provided between the supporting table 2*b* for the pod supported by the indexer 2 and the reticle R received therein so as to enable the carrying hand to operate therebetween.

A reticle transfer robot 60 is structured to have a linear movement mechanism adapted to linearly move in the left-right direction of FIG. 9 and a retractable arm 61 provided with a retractable motion and vertical movement mechanism and a reticle hand 62 for handling the reticle R are mounted on the linear movement mechanism.

The reticle hand 62 moved to the indexer 2 at the left side in FIG. 9 by the linear movement mechanism receives the reticle R from the supporting table 2*b* of the pod by the retractable arm 61 and put the reticle R into the reticle stocker 1*a* shown in the right side in FIG. 9. The reticle stocker 1*a* can be structured to stock a plurality of reticles like a storage rack with a lamination state of reticles using shelves.

The retractable arm 61 for carrying a reticle can be rotated about an axis perpendicular to the drawing sheet surface in FIG. 9. The reticle can be delivered to a reticle contamination examining device 70 or a reticle prealignment unit 80 by rotation and retracting operation of the retractable arm 61.

Next, arraignment of a pod P, indexer 2 and reticle stocker 1*a* will be explained using FIG. 10, which shows a cross section taken along lines "10"—"10" of FIG. 9. Note that the horizontal carry robot is omitted in FIG. 10.

Figure 10:
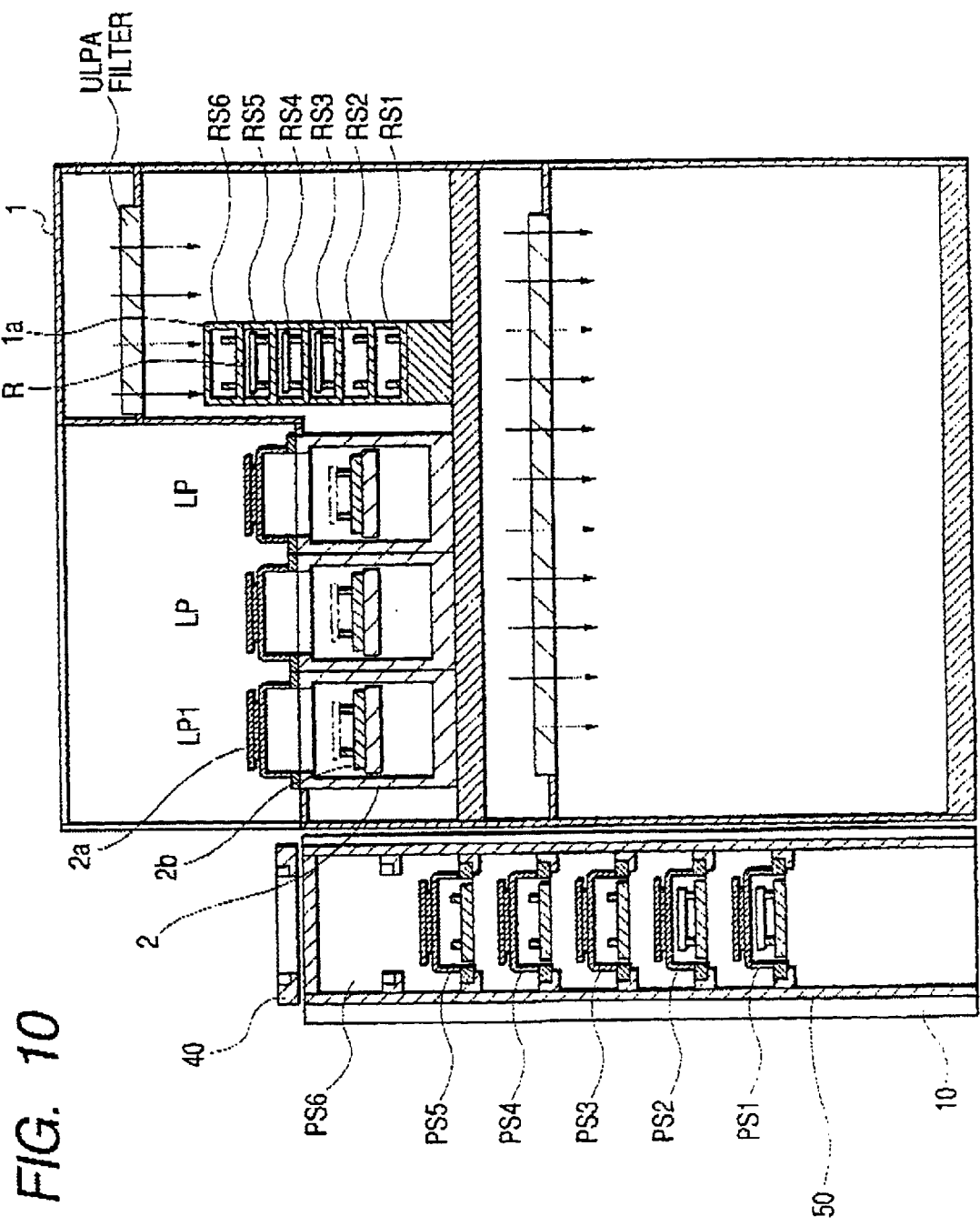
FIG. 10 a view for explaining arrangement of a pod storage rack, indexer and reticle stocker.

The pod storage rack 50 is shown at the left side in FIG. 10. In the pod storage rack 50, a pod without presence of the reticle is received in a given shelf since the reticle previously received in that pod is now stocked in the reticle stocker 1a within the chamber 1 or is loaded in a reticle stage in a semiconductor exposing apparatus not shown, while the reticle R taken out of the reticle stocker 1a or the reticle to be used in future is received in the pod which is stocked in the shelf of the pod storage rack 50.

In FIG. 10, three indexers 2 are provided and the lid portion 2a of the pod is left outside the chamber 1 and the supporting table 2b of the pod is caused to be lowered while supporting the reticle R.

Reticles R are stocked in the reticle stocker 1a in the chamber 1. There is a super clean air blowing to the reticle stocker 1a in the chamber 1 through a ULPA filter so as to assure cleanliness of the reticles R.

It is noted that in the SMIF system, cleanliness inside the pod is assured but cleanliness of the outer periphery of the pod is not assured. For this reason, a possibility that a reticle is exposed to dust or the like during the operation of transfer becomes higher in a state in which the lid portion 2a of the pod is separated from the supporting table 2a. In the conventional method, in the case of separation of the lid portion of the pod, the lid portion 2a of the pod is left outside the chamber 1 so that only the supporting table 2b is present within the chamber 1. In contrast, according to the present embodiment of the invention, cleanliness of the reticle R is assured by such manner that the reticle R taken out of the pod is stocked in the reticle stocker 1a disposed in a clean environment so that super clean air is applied to the reticle as mentioned above.

The reticle R and the pod receiving it must be normally agreed in a point of production control. In the present embodiment of the invention, management or control is made to relationship between the reticle stocker 1a and the pod storage rack 50.

Figure 11:
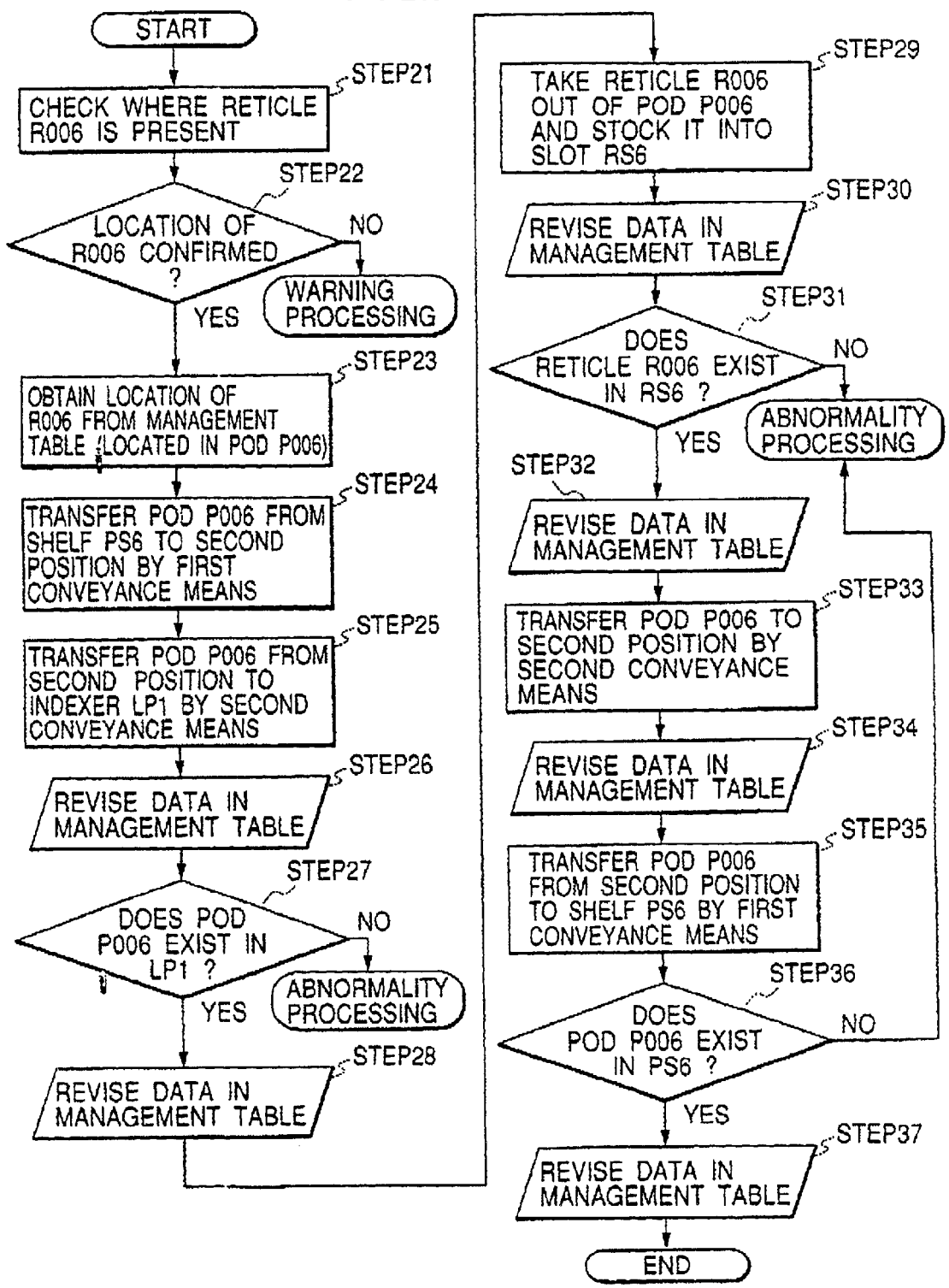
FIG. 11 is a flowchart for management of a pod and reticle in the pod storage rack, indexer and reticle stocker.

FIG. 11 is a flowchart for explaining a sequence that a given reticle R006 is transferred to the reticle stocker 1a.

At first, confirmation is made to whether the reticle R006 exists in data base within a controller not shown (step 21). When presence of the reticle R006 has been confirmed (step 22), location of the reticle R006 is searched on the table (see FIG. 12) such that which portion the reticle R006 exists in the pod storage rack 50, the indexer 2 or the reticle stocker 1a. (step 23) In this embodiment, since the reticle R006 received in the pod P006 which is stocked in the shelf PS6 of the pod storage rack 50 has been confirmed, the pod P006 is taken out of the shelf PS6 and is transferred to the second position $S_2$ by the pod lift stage 20 which is first conveyance means, (step 24) Then, the horizontal hand which is second conveyance means receives the pod P006 at the second position $S_2$ and transfers the pod P006 to the indexer LP1 of the indexers 2, (Step 25) When the pod P006 is transferred to the indexer LP1, the content of the management table is revised (see FIG. 13), (step 26) After the lid 2a and the supporting table 2b of the pod P006 have been separated from each other, the reticle carry robot grasps the reticle R006 to put it into the slot RS6 of the reticle stocker 1a, (step 29) After it is confirmed that the reticle R006 exists in the slot RS6 of the reticle stocker 1a, the data of the management table is revised. (step 31) After that, in this sequence, the indexer LP1 moves up so that the pod P006 without presence of the reticle R006 is transferred to the second position $S_2$ (step 33) by the horizontal carry robot 3 which is the second conveyance means and the pod P006 is delivered at the position $S_2$ to the pod lift stage 20 which is the first conveyance means. Then, the pod lift stage 20 goes down and the pod P006 without presence of the reticle R006 is stocked into the shelf PS6 of the pod storage rack 50, (step 35) After confirmation of it, the data of the management table is revised as in FIG. 14 (step 37) and a series of the sequence is completed.

In the above exemplified embodiment, although the pod without presence of the reticle is caused to be stocked in the pod storage rack so as to stock the reticle R into the reticle stocker 1a, the pod without presence of the reticle may stand by at the indexer LP1 during the course of the sequence.

If confirmation of presence could not be made in each of the corresponding steps, a warning processing or abnormality processing is executed.

Figure 15:
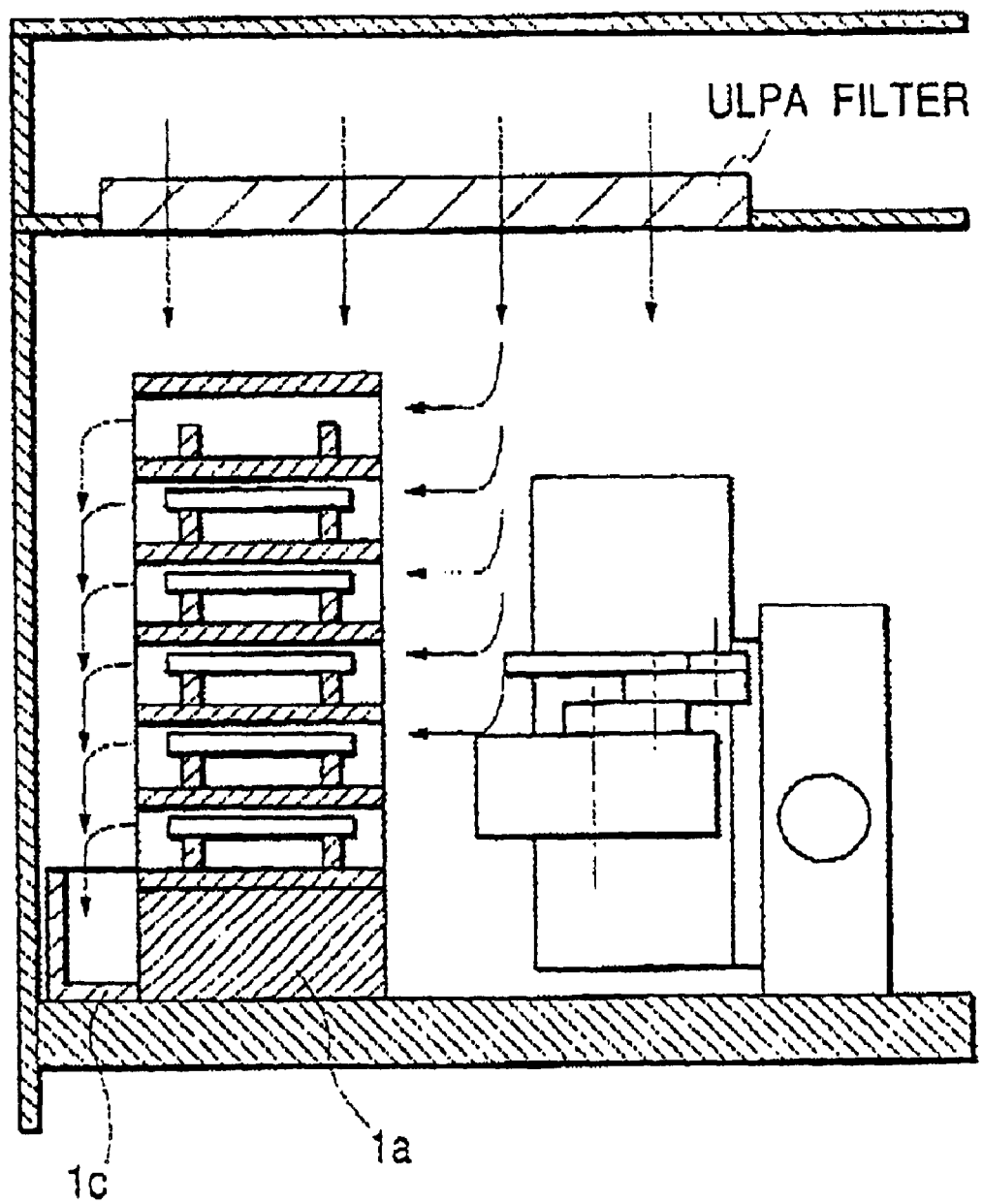
FIG. 15 is a schematic view for explaining a state in which a stream of clean air for a reticle stocker is created in a chamber.

FIG. 15 is a schematic view showing a state that super clean air is blowing to the inside of the reticle stocker 1a. In the chamber 1, the super clean air passing through the ULPA filter provided above is blowing to the reticle stocker 1a and reaches an air outlet 1c so as to maintain continuous blowing to the reticle stocker 1a. Thus, the reticle R stocked in the reticle stocker 1a can be recovered in cleanliness and the cleanliness of the reticle can be maintained.

Figure 6:
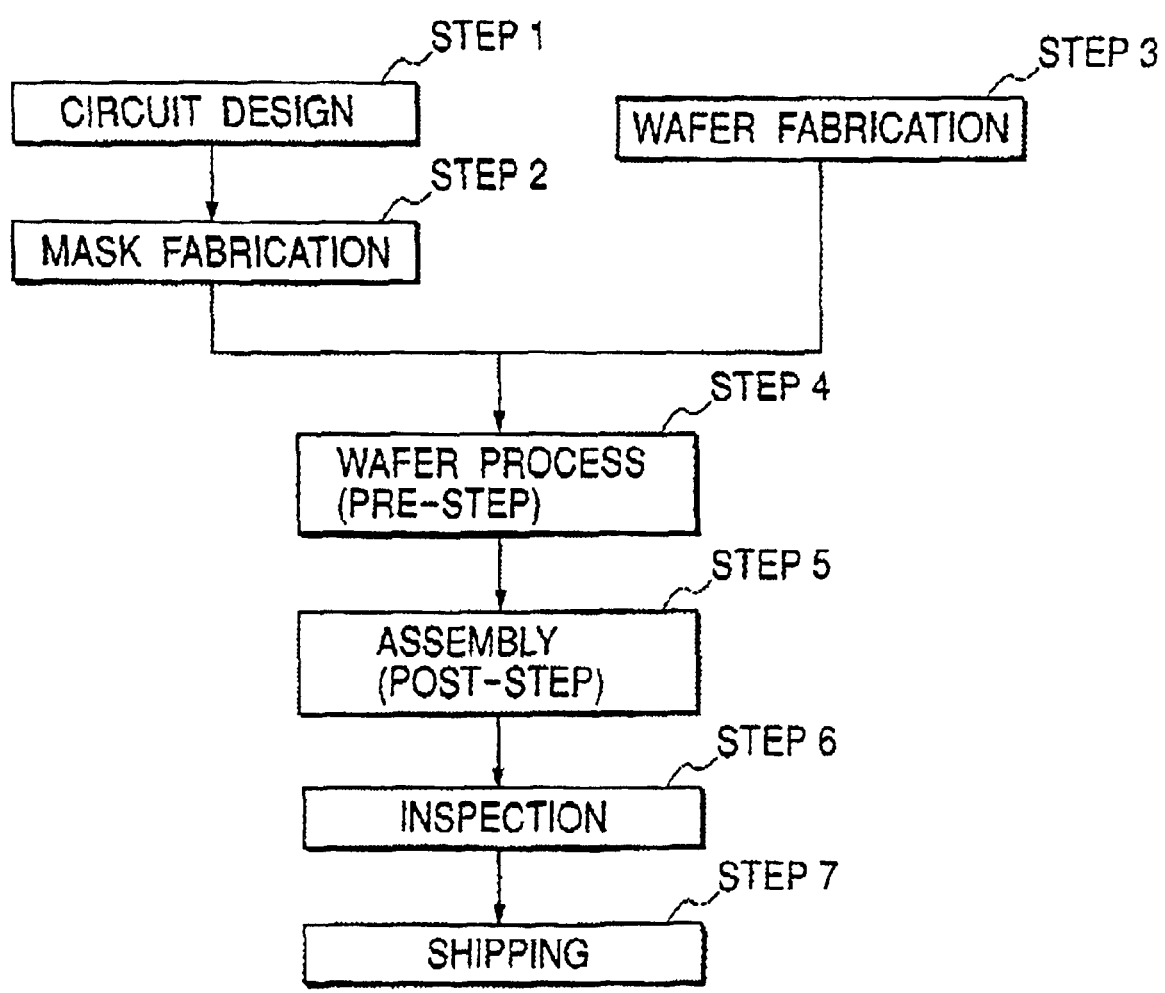
FIG. 6 is a flowchart to show a device fabrication method.

Described next is an example of a device fabrication method making use of the semiconductor fabrication apparatus described above. FIG. 6 shows a fabrication flow of semiconductor devices (semiconductor chips such as ICs, LSIs, and so on, or liquid-crystal panels, CCDS, etc.). Step 1 (circuit design) is a step of circuit design of the semiconductor devices. Step 2 (mask fabrication) is a step of fabricating masks being substrates with circuit patterns thus designed. Step 3 (wafer fabrication) is a step of making wafers of a material of silicon or the like. Step 4 (wafer process) is called a pre-step to form actual circuitry on each wafer by the photolithography technology, using the masks and wafers prepared above. Step 5 (assembly) is called a poststep and is a step of forming semiconductor chips from the wafer produced in step 4, which includes steps such as an assembly step (dicing and bonding), a packaging step (encapsulation of chip), and so on. Step 6 (inspection) is a step of carrying out inspection such as an operation check test, a durability test, etc. of the semiconductor devices fabricated in step 5. The semiconductor devices are completed through these steps and then shipped (step 7).

Figure 7:
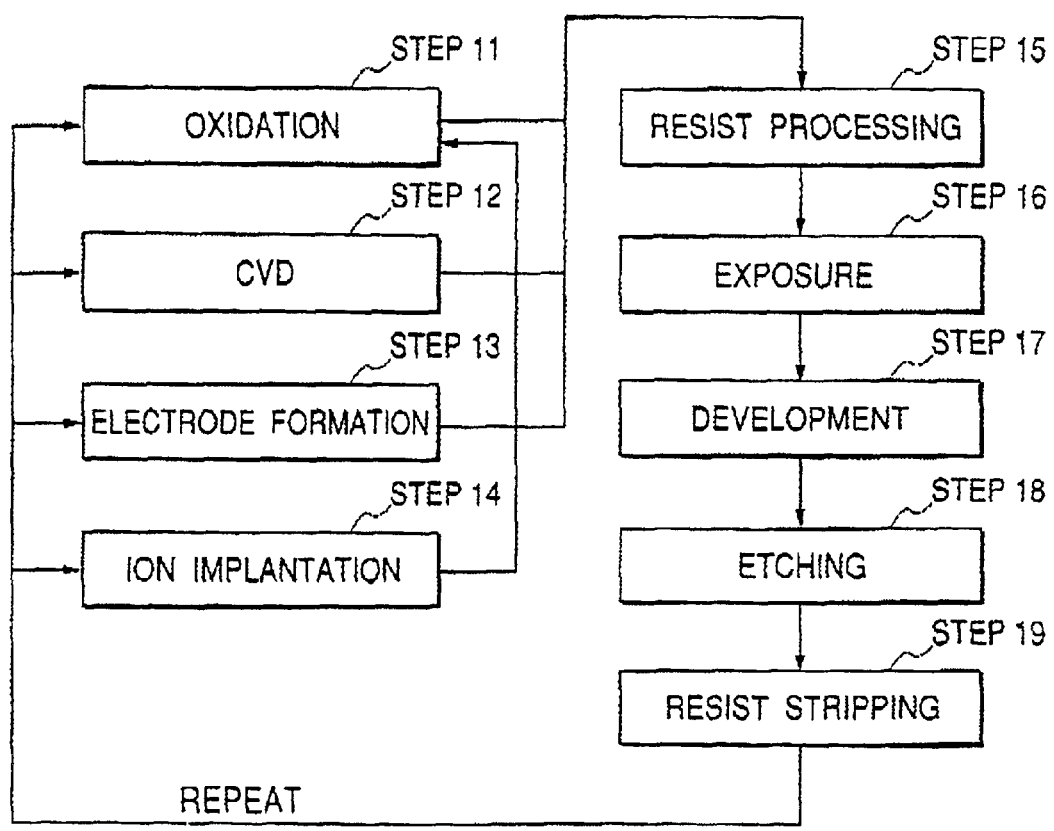
FIG. 7 is a flowchart to show a wafer process.
Figure 8A:
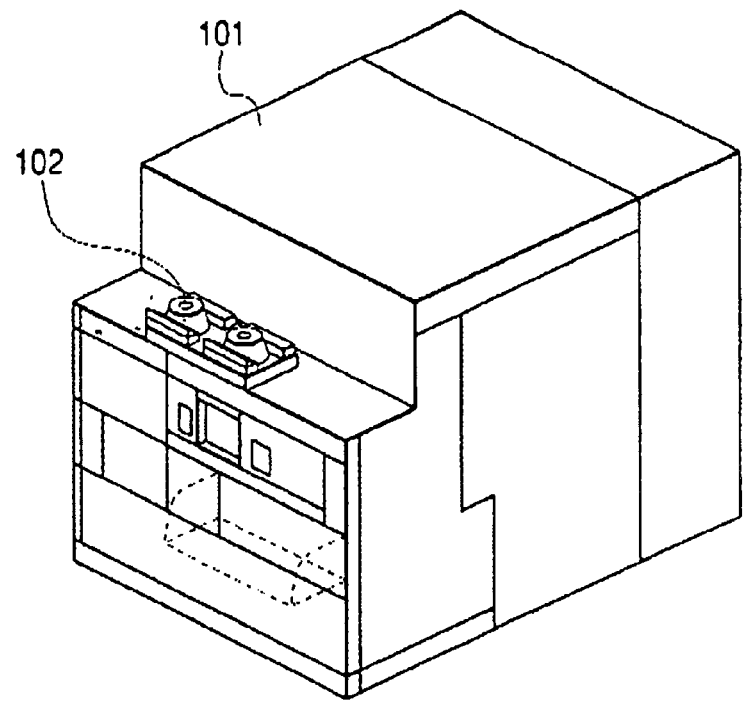
Figure 8B:
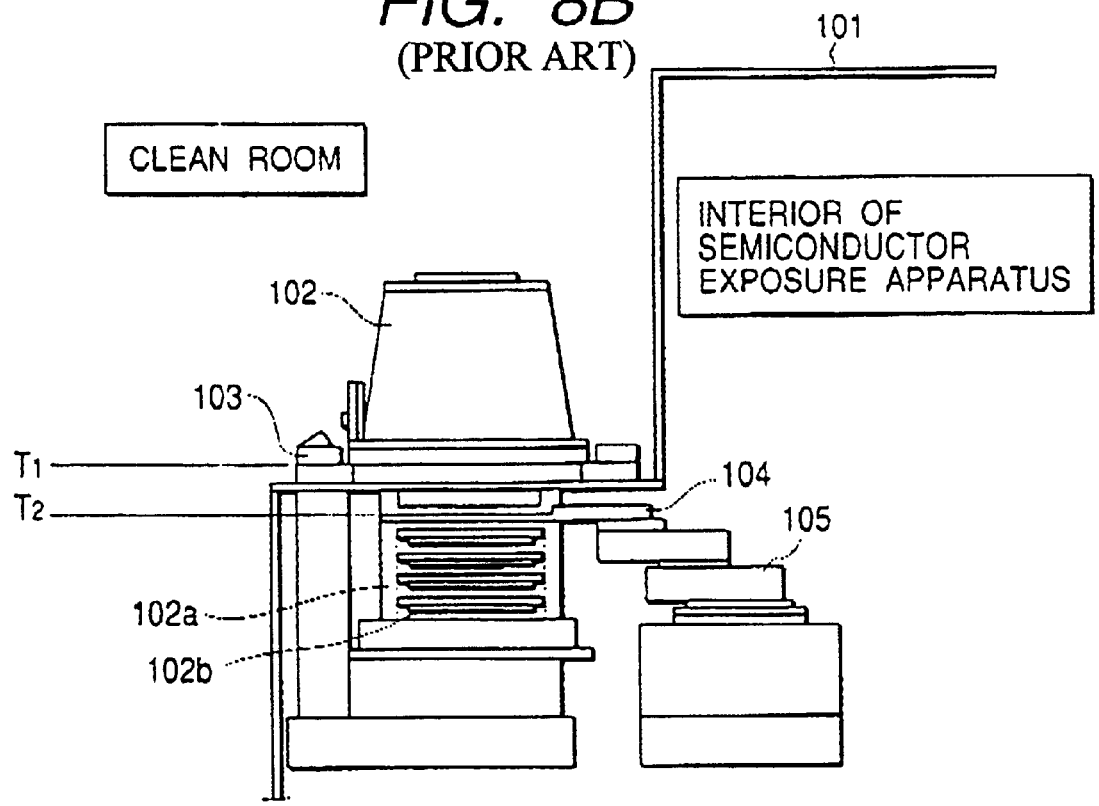

FIG. 7 shows the detailed flow of the above wafer process. Step 11 (oxidation) is a step of oxidizing the surface of the wafer. Step 12 (CVD) is a step of forming an insulating film in the wafer surface. Step 13 (electrode formation) is a step of forming electrodes on the wafer by evaporation. Step 14 (ion implantation) is a step of implanting ions into the wafer. Step 15 (resist processing) is a step of applying a photosensitive agent onto the wafer. Step 16 (exposure) is a step of printing the circuit pattern of the mask onto the wafer by the above-stated exposure apparatus. Step 17 (development) is a step of developing the exposed wafer. Step 18 (etching) is a step of etching portions other than the developed resist image away. Step 19 (resist stripping) is a step of removing the resist unnecessary after the etching. The circuit patterns are formed in multiple layers on the wafer by repetition of these steps. Use of the fabrication method of the present example permits the semiconductor devices to be fabricated in high integration over the fabrication limit heretofore.

The present invention presents the effects described below because of the above-stated structure.

In the semiconductor fabrication apparatus using the SMIF system, the invention facilitates the supply and retrieval works of the pod by the operator or by the AGV of the floor running type. Therefore, the invention makes great contribution to improvement in work efficiency of pod replacement, reduction of facility cost, increase in degrees of freedom for the layout, and so on.

Since a plurality of pods can be stored in the pod stocker, the time necessary for the pod replacement can be decreased remarkably, and thus the throughput of the semiconductor fabrication apparatus can be increased.

In addition, since the reticle in the pod can be preserved and stocked in a clean environment in the chamber, cleanliness of the reticle can be recovered to be maintained, and because the management or control can be realized while maintaining the relation between the reticle and the pod, the management or control of safety exposure process can be accomplished.

What is claimed is:

1. A semiconductor fabrication apparatus in which a pod that receives a single substrate using a substrate supporting table and a lid member in a sealing state is loaded from outside of a chamber and the pod is opened within the chamber so as to enable the substrate received in the pod to be held and managed, said apparatus comprising:

a first pod conveyance device that transfers said pod from a pod loading position to a pod opening position;

a plurality of pod opening devices that cause the lid member of the pod transferred by said first pod conveyance device to be left outside the chamber and cause the supporting table to be separated into the chamber from said pod;

a substrate storage rack provided within said chamber, said substrate storage rack capable of storing a plurality of substrates;

a substrate carrying device provided within said chamber for taking out the substrate on the substrate supporting table and putting the substrate into said substrate storage rack; and a console device that executes table management for each pod ID of a plurality of pods disposed on said pod opening device and each shelf ID of a plurality of shelves allocated to said substrate storage rack.

2. A semiconductor fabrication apparatus in which a pod that receives a single substrate using a substrate supporting table and a lid member in a sealing state is loaded from outside of a chamber, and the pod is opened within the chamber so as to enable the substrate received in the pod to be held and managed, said apparatus comprising:

a second pod conveyance device that allows said pod to be loaded and transfers said pod to a position at which said pod is delivered;

a first pod conveyance device that receives said pod transferred by said second pod conveyance device at the delivered position and transfers said pod to a pod opening position;

a pod opening device that causes the lid member of the pod transferred by said first pod conveyance device to be left outside the chamber and causes the supporting table to be separated into the chamber from said pod;

a substrate storage rack provided within said chamber, said substrate storage rack capable of storing a plurality of substrates; and a substrate carrying device provided within said chamber for taking out the substrate on the substrate supporting table and putting the substrate into said substrate storage rack, with said first pod conveyance device being disposed above said pod opening device.

3. A semiconductor fabrication apparatus according to claim 2 further comprising a pod storage device capable of storing a plurality of pods in a state of lamination in parallel along a transfer route of the pod transferred by said second pod conveyance device.

4. A semiconductor fabrication apparatus according to claim 2, wherein said pod opening device is provided at a position branched off from a pod conveyance route defined by said first pod conveyance device.

5. A semiconductor fabrication apparatus according to claim 2, wherein a pod standby position is provided at a position near the pod delivered position between said first pod conveyance device and said second pad conveyance device so as not to interfere with the pod which is being transferred.

6. A semiconductor fabrication apparatus according to claim 2, wherein said first pod conveyance device and second pod conveyance device are different in manner of supporting the pod from each other.

7. A semiconductor fabrication apparatus according to claim 6, wherein said first pod conveyance device holds the pod from the lid side thereof and said second pod conveyance device supports the pod from the bottom side thereof.

8. A semiconductor fabrication apparatus in which a pod that receives a single substrate using a substrate supporting table and a lid member in a sealing state is loaded from outside of a chamber, and the pod is opened within the chamber so as to enable the substrate received in the pod to be held and managed, said apparatus comprising:

a second pod conveyance device that allows said pod to be loaded and transfers said pod to a position of which said pod is delivered;

a first pod conveyance device that receives said pod transferred by said second pod conveyance device at the delivered position and transfers said pod to a pod opening position;

a pod opening device that causes the lid member of the pod transferred by said first pod conveyance device to be left outside the chamber and causes the supporting table to be separated into the chamber from said pod;

a substrate storage rack provided within said chamber, said substrate storage rack capable of storing a plurality of substrates;

a substrate carrying device provided within said chamber for taking out the substrate on the substrate supporting table and putting the substrate into said substrate storage rack; and a console device that executes table management for each pod ID of a plurality of pods disposed on said pod opening device and each shelf ID of a plurality of shelves allocated to said substrate storage rack.

9. A semiconductor fabrication apparatus in which a pod that receives a single substrate using a substrate supporting table and a lid member in a sealing state is loaded from outside of a chamber and the pod is opened within the chamber so as to enable the substrate received in the pod to be held and managed, said apparatus comprising:

a first pod conveyance device that transfers said pod from a pod loading position to a pod opening position;

a plurality of pod opening devices that cause the lid member of the pod transferred by said first conveyance device to be left outside the chamber and cause the supporting table to be separated into the chamber from said pod;

a substrate storage rack provided within said chamber, said substrate storage rack capable of storing a plurality of substrates;

a substrate carrying device provided within said chamber for taking out the substrate on the substrate supporting table and putting the substrate into said substrate storage rack;

a pod storage device capable of storing a plurality of pods in shelves; and a console device that executes table management for each shelf ID of a plurality of shelves allocated to said pod storage device, each pod ID of a plurality of pods stocked in the shelves of said pod storage device and each shelf ID of a plurality of shelves allocated to said substrate storage rack.

10. A semiconductor fabrication apparatus according to claim 9, wherein said table management includes a state that the substrate does not exist in said pod storage device, said pod and said substrate storage rack.

* * * * *

UNITED STATES PATENT AND TRADEMARK OFFICE
CERTIFICATE OF CORRECTION

PATENT NO. : 6,811,369 B2
DATED : November 2, 2004
INVENTOR(S) : Kohei Yamada

It is certified that error appears in the above-identified patent and that said Letters Patent is hereby corrected as shown below:

Column 1,
Line 52, "pinto" should read -- into --.

Column 2,
Line 8, "It" should read -- it --.
Line 47, "exposure." should read -- exposure --.
Line 51, "semiconductor, fabrication" should read -- semiconductor fabrication --.

Column 3,
Line 7, "mechanist" should read -- mechanism --.

Column 7,
Line 19, "20. a" should read -- 20, a --.
Line 27, "second S" should read -- second --.

Column 9,
Line 52, "means, (step 24)" should read -- means. (step 24) --.
Line 55, "indexers 2, (Step 25)" should read -- indexers 2. (step 25) --.
Line 58, "(see FIG, 13), (step 26)" should read -- (see FIG. 13). (step 26) --.
Line 61, "1a, (step" should read -- 1a. (step --.

Column 10,
Line 6, "50,(step" should read -- 50. (step --, line 32, "CCDS," should read -- CCDs --.

Column 12,
Line 22, "second pad" should read -- second pod --.

Signed and Sealed this

Twenty-sixth Day of April, 2005

JON W. DUDAS
*Director of the United States Patent and Trademark Office*